(12) United States Patent
Tang (10) Patent No.: US 11,665,935 B2
(45) Date of Patent: May 30, 2023

(54) OLED DISPLAY PANEL AND METHOD FOR MANUFACTURING THE SAME

(71) Applicant: SHENZHEN CHINA STAR OPTOELECTRONICS SEMICONDUCTOR DISPLAY TECHNOLOGY CO., LTD., Shenzhen (CN)

(72) Inventor: Jia Tang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 310 days.

(21) Appl. No.: 16/972,977

(22) PCT Filed: Oct. 30, 2020

(86) PCT No.: PCT/CN2020/125035
§ 371 (c)(1),
(2) Date: Dec. 7, 2020

(87) PCT Pub. No.: WO2022/052249
PCT Pub. Date: Mar. 17, 2022

(65) Prior Publication Data
US 2022/0320210 A1    Oct. 6, 2022

(30) Foreign Application Priority Data
Sep. 9, 2020 (CN) .......................... 202010940859.6

(51) Int. Cl.
*H01L 27/32* (2006.01)
*H01L 51/56* (2006.01)
*H01L 27/12* (2006.01)

(52) U.S. Cl.
CPC ....... *H10K 59/124* (2023.02); *H01L 27/1288* (2013.01); *H01L 27/1292* (2013.01);
(Continued)

(58) Field of Classification Search
CPC ............. H01L 27/3258; H01L 27/1288; H01L 27/1292; H01L 27/1296; H01L 51/0018
See application file for complete search history.

(56) References Cited

U.S. PATENT DOCUMENTS 7,402,467 B1 * 7/2008 Kadono ............... H01L 27/1248
257/E21.414
2006/0220016 A1 * 10/2006 Lee ...................... H01L 51/5259
257/59
(Continued)

FOREIGN PATENT DOCUMENTS

| CN | 103578399 A | 2/2014 |
|---|---|---|
| CN | 106783883 A | 5/2017 |

(Continued)

OTHER PUBLICATIONS

Machine translation, Liu, Chinese Pat. Pub. No. CN110797380A, translation date: Dec. 5, 2022, Espacenet, all pages. (Year: 2022).*
(Continued)

*Primary Examiner* — Victoria K. Hall
(74) *Attorney, Agent, or Firm* — The Roy Gross Law Firm, LLC; Roy Gross (57) ABSTRACT

An organic light-emitting diode (OLED) display panel and a method for manufacturing the same are provided. The OLED display panel at least includes a thin film transistor (TFT) array substrate, a passivation layer, a planarization layer, and planarization-compensating layer. The planarization layer has a first planarization part corresponding to a light-emitting area, and a second planarization part corresponding to a defining area and a part of the light-emitting
(Continued)

area. Height of a surface of the planarization-compensating layer from the surface of the TFT array substrate and height of a surface of the second planarization part from the surface of the TFT array substrate are level.

20 Claims, 5 Drawing Sheets

(52) U.S. Cl.
CPC ......... *H01L 27/1296* (2013.01); *H10K 50/84* (2023.02); *H10K 71/00* (2023.02); *H10K 71/135* (2023.02); *H10K 71/233* (2023.02); *H10K 59/1201* (2023.02)

(56) References Cited

U.S. PATENT DOCUMENTS

| | | | | |
|---|---|---|---|---|
| 2014/0015866 A1* | 1/2014 | Teranishi | ............. | G09G 3/2074 345/690 |
| 2016/0133681 A1* | 5/2016 | Nam | ................... | H01L 27/3258 257/40 |
| 2016/0141349 A1* | 5/2016 | Yun | ..................... | H01L 27/3258 438/23 |
| 2018/0053815 A1* | 2/2018 | Lee | ....................... | H01L 51/524 |
| 2018/0212198 A1* | 7/2018 | Inoue | .................. | H01L 27/3248 |
| 2020/0091459 A1* | 3/2020 | Senoo | ................. | H01L 27/3258 |
| 2020/0168682 A1 | 5/2020 | Kishimoto | | |
| 2020/0388788 A1* | 12/2020 | Long | ................... | H01L 27/3246 |
| 2021/0020718 A1* | 1/2021 | Nishioka | ............. | H01L 27/3258 |
| 2021/0028249 A1* | 1/2021 | Ding | ....................... | H01L 51/56 |
| 2021/0202583 A1* | 7/2021 | Du | ........................ | H01L 27/322 |

FOREIGN PATENT DOCUMENTS

| | | | | | |
|---|---|---|---|---|---|
| CN | 110797380 | A | * | 2/2020 | ......... H01L 27/3248 |
| CN | 110797380 | A | | 2/2020 | |
| CN | 110890409 | A | | 3/2020 | |
| CN | 111146215 | A | * | 5/2020 | ......... H01L 27/1248 |
| CN | 111146215 | A | | 5/2020 | |
| WO | 2019186807 | A1 | | 10/2019 | |

OTHER PUBLICATIONS

Machine translation, Xu, Chinese Pat. Pub. No. CN111146215A, translation date: Dec. 7, 2022, Espacenet, all pages. (Year: 2022).*
International Searching Authority, Written Opinion of the International Searching Authority, PCT App. No PCT/CN2020/125035, dated May 27, 2021, all pages. (Year: 2021).*
Machine translation by Google of International Searching Authority, Written Opinion of the International Searching Authority, PCT App. No PCT/CN2020/125035, dated May 27, 2021, all pages. (Year: 2021).*
English translation, International Searching Authority, International Search Report, PCT App. No PCT/CN2020/125035, dated May 26, 2021, all pages. (Year: 2021).*

* cited by examiner

FIG. 1

| Providing a thin film transistor (TFT) array substrate; wherein the TFT array substrate has a plurality of pixel areas; wherein each pixel area comprises a light-emitting area and a defining area surrounding the light-emitting area; wherein a surface of the TFT array substrate further has at least one protrusion corresponding to the light-emitting area | ~S10 |

↓

| Sequentially manufacturing a passivation layer and a planarization layer on the surface of the TFT array substrate; wherein the passivation layer completely covers the at least one protrusion; wherein an area of the planarization layer corresponding to a part of the light-emitting area has an uneven surface | ~S20 |

↓

| Performing, using a halftone mask, a thinning process on a part of the planarization layer located in the light-emitting area to form a first planarization part and a second planarization part | ~S30 |

↓

| Printing, using the second planarization part as a barrier, a planarization-compensating layer on the first planarization part; wherein height of a surface of the planarization-compensating layer from the surface of the TFT array substrate and height of a surface of the second planarization part from the surface of the TFT array substrate are level | ~S40 |

↓

| Manufacturing an anode metal layer on the planarization-compensating layer and second planarization part, and then manufacturing a pixel defining layer on the second planarization part; wherein the pixel defining layer covers a part of the anode metal layer | ~S50 |

↓

| Printing, using the pixel defining layer as a barrier, an organic light-emitting layer on a part of the anode metal layer corresponding to the light-emitting area | ~S60 |

OLED DISPLAY PANEL AND METHOD FOR MANUFACTURING THE SAME

CROSS REFERENCE TO RELATED APPLICATIONS

This application is a National Phase of PCT Patent Application No. PCT/CN2020/125035 having International filing date of Oct. 30, 2020, which claims the benefit of priority of Chinese Application No. 202010940859.6 filed on Sep. 9, 2020. The contents of the above applications are all incorporated by reference as if fully set forth herein in their entirety.

FIELD OF INVENTION

The present disclosure relates to a technical field of displays, and more particularly to an organic light-emitting diode (OLED) display panel and a method for manufacturing the same.

BACKGROUND OF INVENTION

Organic light-emitting diodes (OLEDs) have characteristics of being self-luminous, having fast response speed, and having large viewing angles, etc., and have broad application prospects. For evaporation of active-matrix organic light emitting diodes (AMOLEDs), evaporated materials that reach pixel areas have good film thickness uniformity, and a requirement for flatness of pixel area substrates is relatively loose. But for inkjet printing (IJP) processes, ink of AMOLEDs, when printed to pixel areas, is fluid. One of main influencing factors of ink spreadability is flatness of a pixel area substrate. It is required that a maximum step difference of an entire pixel area be as small as possible. If this specification is exceeded, the ink spreadability is uneven. After drying, film thickness is uneven, which ultimately affects a luminous effect. Thus, planarization ability of a planarization layer (PLN) of an IJP-AMOLED has a more stringent requirement.

PLN is an organic photosensitive material. An existing solution is to thicken a PLN film. The larger the step difference is, the thicker the PLN is required. Thus, there are problems and possible risks: (1) one-time planarization ability of the PLN is limited; that is, when a step difference of a substrate reaches a certain level, even if thickness of the PLN has been increased to a very thick level (above 4 um), flatness of the PLN still cannot meet the requirement; (2) all PLNs have designed holes; if a hole is too deep, subsequent film deposition is affected: for example, trace climbing and breaking.

In summary, for the existing IJP-AMOLED manufacturing process, it is difficult for the PLN to meet the flatness manufacturing requirement. The maximum step difference of the entire pixel area is larger. The ink spreadability is uneven. After drying, the film thickness of a light-emitting layer is uneven, thereby affecting a display effect of an OLED display panel.

SUMMARY OF INVENTION

Technical problems are as follows. For an existing inkjet printing process-active-matrix organic light emitting diode (IJP-AMOLED) manufacturing process, it is difficult for a planarization layer (PLN) to meet a flatness manufacturing requirement. A maximum step difference of an entire pixel area is larger. Ink spreadability is uneven. After drying, film thickness of a light-emitting layer is uneven, thereby affecting a display effect of an organic light-emitting diode (OLED) display panel.

Technical solutions are as follows. In a first aspect, an OLED display panel is provided. The OLED display panel includes a thin film transistor (TFT) array substrate, a passivation layer, a planarization layer, a planarization-compensating layer, an anode metal layer, a pixel defining layer, and an organic light-emitting layer.

The TFT array substrate has a plurality of pixel areas; wherein each pixel area includes a light-emitting area and a defining area surrounding the light-emitting area; wherein a surface of the TFT array substrate further has at least one protrusion corresponding to the light-emitting area. The passivation layer is manufactured on the surface of the TFT array substrate and completely covers the at least one protrusion. The planarization layer has a first planarization part and a second planarization part; wherein the first planarization part has an uneven surface and corresponds to the light-emitting area; wherein the second planarization part is in contact with two edges of the first planarization part and corresponds to the defining area and a part of the light-emitting area; wherein thickness of the first planarization part is lesser than thickness of the second planarization part. Height of a surface of the planarization-compensating layer from the surface of the TFT array substrate and height of a surface of the second planarization part from the surface of the TFT array substrate are level. An anode metal layer is manufactured on the second planarization part and the planarization-compensating layer. A pixel defining layer is manufactured on the second planarization part and covers a part of the anode metal layer. An organic light-emitting layer is manufactured on the anode metal layer and corresponds to the light-emitting area.

The planarization-compensating layer is manufactured by an inkjet printing process printing an organic ink. In the OLED display panel provided by an embodiment of the present disclosure, a material of the planarization layer is a hydrophobic organic material.

In the OLED display panel provided by an embodiment of the present disclosure, the anode metal layer is a three-layer ITO/Ag/ITO conductive layer or a single-layer ITO transmissive conductive layer.

In the OLED display panel provided by an embodiment of the present disclosure, the TFT array substrate is any type of low-temperature polysilicon TFT, oxidized TFT, and solid phase crystallized polysilicon TFT.

In the OLED display panel provided by an embodiment of the present disclosure, a material of the passivation layer is silicon nitride or silicon oxide.

In the OLED display panel provided by an embodiment of the present disclosure, a material of the planarization-compensating layer is an organic insulating material.

In a second aspect, an OLED display panel is also provided. The OLED display panel includes a TFT array substrate, a passivation layer, a planarization layer, a planarization-compensating layer, an anode metal layer, a pixel defining layer, and an organic light-emitting layer.

The TFT array substrate has a plurality of pixel areas; wherein each pixel area includes a light-emitting area and a defining area surrounding the light-emitting area; wherein a surface of the TFT array substrate further has at least one protrusion corresponding to the light-emitting area. The passivation layer is manufactured on the surface of the TFT array substrate and completely covers the at least one protrusion. The planarization layer has a first planarization part and a second planarization part; wherein the first planarization part has an uneven surface and corresponds to the light-emitting area; wherein the second planarization part is in contact with two edges of the first planarization part and corresponds to the defining area and a part of the light-emitting area; wherein thickness of the first planarization part is lesser than thickness of the second planarization part. Height of a surface of the planarization-compensating layer from the surface of the TFT array substrate and height of a surface of the second planarization part from the surface of the TFT array substrate are level. An anode metal layer is manufactured on the second planarization part and the planarization-compensating layer. A pixel defining layer is manufactured on the second planarization part and covers a part of the anode metal layer. An organic light-emitting layer is manufactured on the anode metal layer and corresponds to the light-emitting area.

In the OLED display panel provided by an embodiment of the present disclosure, a material of the planarization layer is a hydrophobic organic material.

In the OLED display panel provided by an embodiment of the present disclosure, the anode metal layer is a three-layer ITO/Ag/ITO conductive layer or a single-layer ITO transmissive conductive layer.

In the OLED display panel provided by an embodiment of the present disclosure, the TFT array substrate is any type of low-temperature polysilicon TFT, oxidized TFT, and solid phase crystallized polysilicon TFT.

In the OLED display panel provided by an embodiment of the present disclosure, a material of the passivation layer is silicon nitride or silicon oxide.

In the OLED display panel provided by an embodiment of the present disclosure, a material of the planarization-compensating layer is an organic insulating material.

In a third aspect, embodiments of the present disclosure also provides a method for manufacturing an OLED display panel. The method includes:

a step S10 of providing a TFT array substrate; wherein the TFT array substrate has a plurality of pixel areas; wherein each pixel area includes a light-emitting area and a defining area surrounding the light-emitting area; wherein a surface of the TFT array substrate further has at least one protrusion corresponding to the light-emitting area;

a step S20 of sequentially manufacturing a passivation layer and a planarization layer on the surface of the TFT array substrate; wherein the passivation layer completely covers the at least one protrusion; wherein an area of the planarization layer corresponding to a part of the light-emitting area has an uneven surface;

a step S30 of performing, using a halftone mask, a thinning process on a part of the planarization layer located in the light-emitting area to form a first planarization part and a second planarization part;

a step S40 of printing, using the second planarization part as a barrier, a planarization-compensating layer on the first planarization part; wherein height of a surface of the planarization-compensating layer from the surface of the TFT array substrate and height of a surface of the second planarization part from the surface of the TFT array substrate are level;

a step S50 of manufacturing an anode metal layer on the planarization-compensating layer and second planarization part, and then manufacturing a pixel defining layer on the second planarization part; wherein the pixel defining layer covers a part of the anode metal layer; and a step S60 of printing, using the pixel defining layer as a barrier, an organic light-emitting layer on a part of the anode metal layer corresponding to the light-emitting area.

In the method for manufacturing the OLED display panel provided by an embodiment of the present disclosure, in the step S10, the TFT array substrate is any type of low-temperature polysilicon TFT, oxidized TFT, and solid phase crystallized polysilicon TFT.

In the method for manufacturing the OLED display panel provided by an embodiment of the present disclosure, in the step S20, a material of the planarization layer is a hydrophobic organic material.

In the method for manufacturing the OLED display panel provided by an embodiment of the present disclosure, in the step S20, a material of the passivation layer is silicon nitride or silicon oxide.

In the method for manufacturing the OLED display panel provided by an embodiment of the present disclosure, in the step S30, the first planarization part has an uneven surface and corresponds to the light-emitting area, the second planarization part is in contact with two edges of the first planarization part and corresponds to the defining area and a part of the light-emitting area, and thickness of the first planarization part is lesser than thickness of the second planarization part.

In the method for manufacturing the OLED display panel provided by an embodiment of the present disclosure, the step S30 further includes: a step S301 of forming a first through hole in a part of the planarization layer corresponding to the defining area; wherein the first through hole extends through the planarization layer and the passivation layer and exposes the TFT array substrate.

In the method for manufacturing the OLED display panel provided by an embodiment of the present disclosure, in the step S40, a material of the planarization-compensating layer is an organic insulating material.

In the method for manufacturing the OLED display panel provided by an embodiment of the present disclosure, in the step S50, wherein the anode metal layer is a three-layered conductive layer of ITO/Ag/ITO or a single-layered transmissive conductive layer of ITO, and a material of the pixel defining layer is an inorganic insulating layer material.

Advantageous effects are as follows. For a comparison of the existing technology and the embodiments of the present disclosure, for the OLED display panel and the method for manufacturing the same provided by the embodiments of the present disclosure, the part of the planarization layer in the light-emitting area having the uneven surface is thinned, and filling of the planarization-compensating layer is performed. In the light-emitting area, an organic film layer with higher flatness can be obtained. Thus, the following problem for the existing IJP-AMOLED manufacturing process is solved. It is difficult for the PLN to meet the flatness manufacturing requirement. The maximum step difference of the entire pixel area is larger. Spreadability of jetted organic ink is uneven. After drying, the film thickness of the light-emitting layer is uneven, thereby affecting the display effect of the OLED display panel.

DETAILED DESCRIPTION OF PREFERRED EMBODIMENTS

Embodiments of the present disclosure are directed to the following technical problem. For an existing inkjet printing process-active-matrix organic light emitting diode (IJP-AMOLED) manufacturing process, it is difficult for a planarization layer (PLN) to meet a flatness manufacturing requirement. A maximum step difference of an entire pixel area is larger. Ink spreadability is uneven. After drying, film thickness of a light-emitting layer is uneven, thereby affecting a display effect of an organic light-emitting diode (OLED) display panel. The present embodiment can solve the deficiency.

Figure 1:
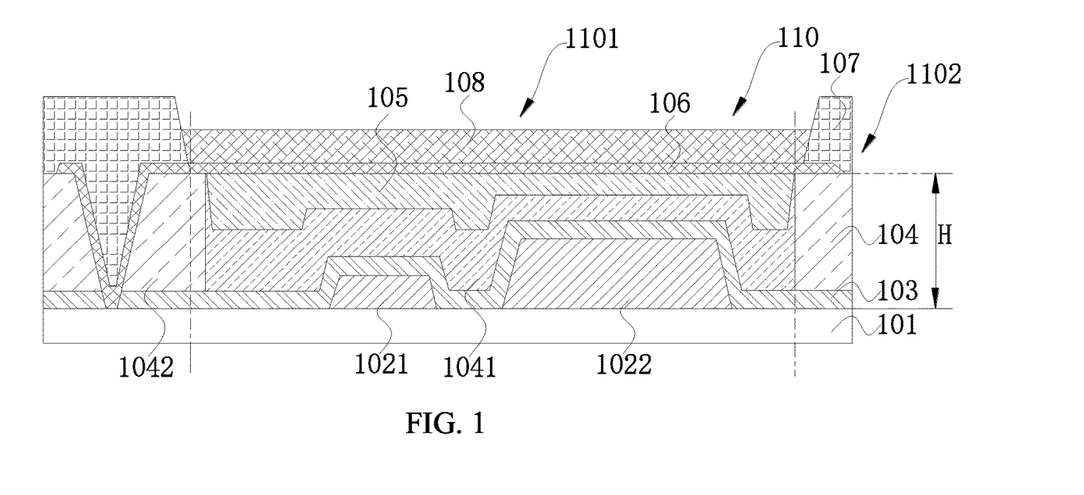
FIG. 1 is a schematic diagram of a structure of an organic light-emitting diode (OLED) display panel provided by embodiments of the present disclosure.

As illustrated in FIG. 1, embodiments of the present disclosure provide an OLED display panel. The OLED display panel includes a thin film transistor (TFT) array substrate 101, a passivation layer 103, a planarization layer 104, a planarization-compensating layer 105, an anode metal layer 106, a pixel defining layer 107, and an organic light-emitting layer 108. The TFT array substrate 101 has a plurality of pixel areas 110. Each pixel area 110 includes a light-emitting area 1101 and a defining area 1102 surrounding the light-emitting area 1101.

Specifically, when the TFT device is manufactured, a scan line and a data line are manufactured at the same time. The scan line is correspondingly connected to a gate of the TFT device and the data line is correspondingly connected to a source of the TFT device. A disposition of the scan line and the data line causes areas corresponding to the scan line and the data line to be higher than another area, forming at least one protrusion. The at least one protrusion includes a first protrusion part 1021 and a second protrusion part 1022. The TFT array substrate 101 is any type of low-temperature polysilicon TFT, oxidized TFT, and solid phase crystallized polysilicon TFT.

Preferably, a material of the passivation layer 103 is silicon nitride or silicon oxide. The passivation layer 103 completely covers the first protrusion part 1021 and the second protrusion part 1022.

Preferably, a material of the planarization layer 104 is a hydrophobic organic material. Preferably, the hydrophobic organic material is a polyimide material or polymethylmethacrylate. The planarization layer 104 has a first planarization part 1041 and a second planarization part 1042. The first planarization part 1041 has an uneven surface and corresponds to the light-emitting area 1101. The second planarization part 1042 is in contact with two edges of the first planarization part 1041 and corresponds to the defining area 1102 and a part of the light-emitting area 1101. Thickness of the first planarization part 1041 is lesser than thickness of the second planarization part 1042.

Specifically, the planarization-compensating layer 105 is printed on the first planarization part 1041 by an IJP process using the second planarization part 1042 as a barrier. Because organic ink itself has fluidity, the organic ink, after dried, automatically fills according to topography, and fills up the uneven surface of the first planarization part 1041. Finally, height of a surface of the planarization-compensating layer 105 from a surface of the TFT array substrate 101 and height of a surface of the second planarization part from the surface of the TFT array substrate are level, and are both H. Preferably, a material of the planarization-compensating layer 105 is an organic insulating material.

Specifically, the anode metal layer 106 is manufactured on the planarization-compensating layer 105 and the second planarization part 1042. The anode metal layer 106 is connected to the TFT array substrate 101 through a first through hole 10421. A material of the anode metal layer is preferably a three-layered conductive layer of indium tin oxide (ITO)/silver(Ag)/ITO or a single-layered transmissive conductive layer of ITO. That is, the OLED display panel can be top-emitting or bottom-emitting. The top-emitting OLED display panel and the bottom-emitting OLED display panel correspond to anode electrodes which are a reflective anode such as ITO/Ag/ITO and an ITO transmissive anode, respectively.

Specifically, the pixel defining layer 107 is manufactured on the second planarization part 1042. The pixel defining layer 107 covers two edges of the anode metal layer 106. A material of the pixel defining layer 107 is an inorganic insulating layer material. The pixel defining layer 107 defines the light-emitting area 1101 and the defining area 1102.

Specifically, the organic light-emitting layer 108 is manufactured in the light-emitting area 1101 by an IJP process.

In the OLED display panel provided by the embodiments of the present disclosure, a hydrophobic organic material is used as the planarization layer. A halftone mask is used to weakly expose step differences of each pixel area. After development, the planarization layer in this area is uniformly lowered along topography by certain film thickness. The organic ink of the planarization-compensating layer is printed using the planarization layer on a periphery of each pixel area (an unexposed part of the planarization layer) as a barrier bank. Because the organic ink itself has fluidity, the organic ink automatically fills according to the topography, and eventually fills up an entirety of each pixel area. The problem that thickness of organic ink for manufacturing the organic light-emitting layer is uneven after drying, affecting OLED device life or efficiency is improved.

Figure 2:
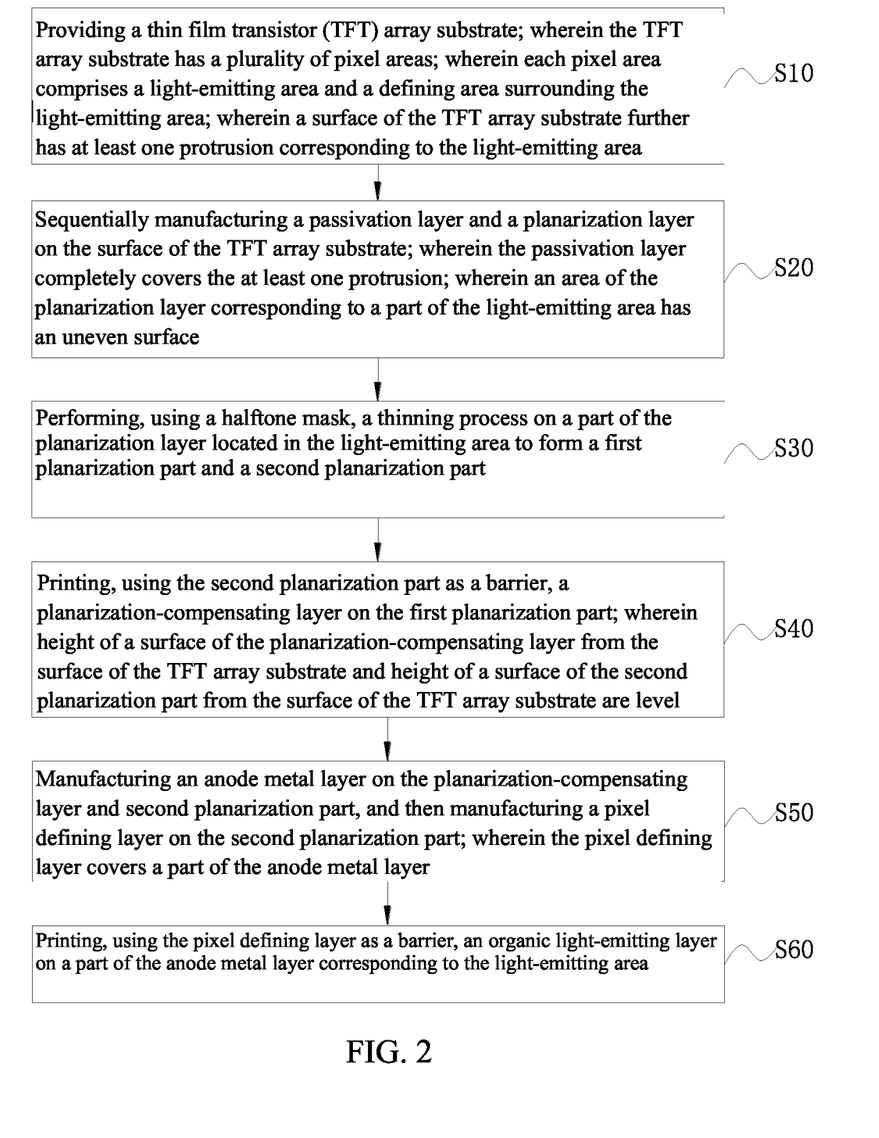
FIG. 2 is a schematic flowchart of a method for manufacturing an OLED display panel provided by embodiments of the present disclosure.

As illustrated in FIG. 2, embodiments of the present disclosure also provide a method for manufacturing the OLED display panel. The method includes the following steps.

In a step S10, a TFT array substrate 101 is provided. The TFT array substrate 101 has a plurality of pixel areas 110. Each pixel area includes a light-emitting area 1101 and a defining area 1102 surrounding the light-emitting area 1101. A surface of the TFT array substrate 101 further has at least one protrusion corresponding to the light-emitting area 1101.

Specifically, the step S10 further includes the following steps.

In a step S101, a substrate is provided. In a step S102, TFT devices are manufactured on a surface of the substrate to form the TFT array substrate 101. When each TFT device is manufactured, a scan line and a data line are manufactured at the same time. The scan line is correspondingly connected to a gate of each TFT device and the data line is correspondingly connected to a source of each TFT device. A disposition of the scan line and the data line causes areas corresponding to the scan line and the data line to be higher than another area, forming at least one protrusion. The at least one protrusion includes a first protrusion part 1021 and a second protrusion part 1022.

Figure 3A:
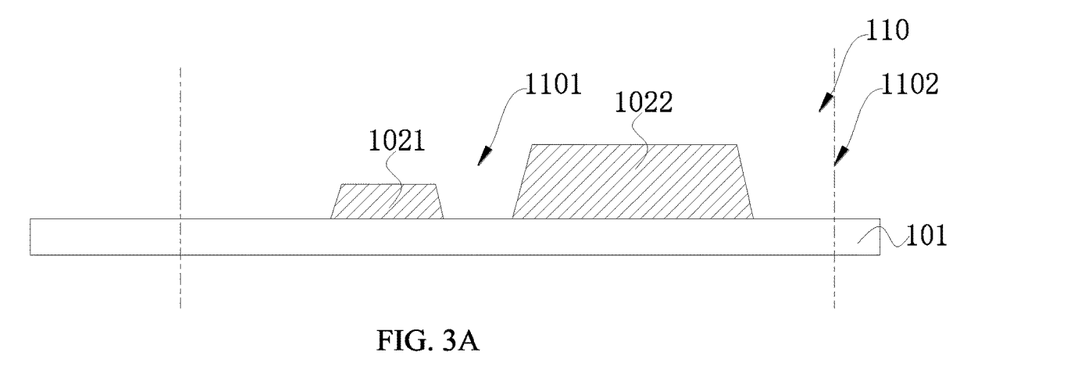
FIGS. 3A-3F are schematic diagrams of structures of the method for manufacturing the OLED display panel provided by the embodiments of the present disclosure.

Specifically, the TFT array substrate 101 has the pixel areas 110. Each pixel area 110 includes the light-emitting area 1101 and the defining area 1102 surrounding the light-emitting area 1101. Both the first protrusion part 1021 and the second protrusion part 1022 correspond to the light-emitting area 1101. Preferably, the TFT array substrate 101 is any type of low-temperature polysilicon TFT, oxidized TFT, and solid phase crystallized polysilicon TFT, as illustrated in FIG. 3A.

In a step S20, a passivation layer 103 and a planarization layer 104 are sequentially manufactured on the surface of the TFT array substrate 101. The passivation layer 103 completely covers the at least one protrusion. An area of the planarization layer 104 corresponding to a part of the light-emitting area 1101 has an uneven surface.

Specifically, the step S20 further includes the following steps.

Figure 3B:
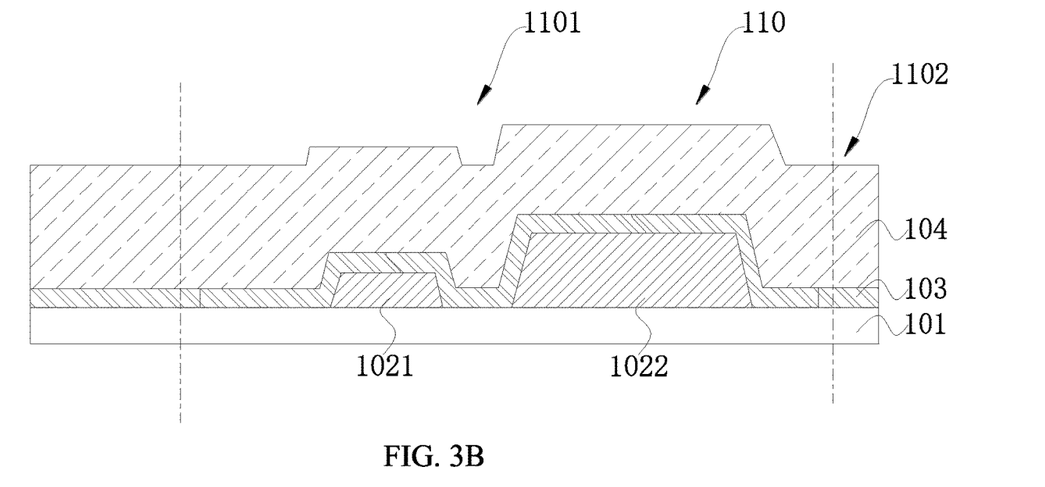

First, the passivation layer 103 is manufactured by deposition on the surface of the TFT array substrate 101. A material of the passivation layer 103 is silicon nitride or silicon oxide. The passivation layer 103 completely covers the first protrusion part 1021 and the second protrusion part 1022. Then, the planarization layer 104 is deposited on the passivation layer 103. A material of the planarization layer 104 is a hydrophobic organic material. Preferably, the hydrophobic organic material is a polyimide material or polymethylmethacrylate. Because of existence of the at least one protrusion, the area of the planarization layer 104 corresponding to the part of the light-emitting area 1101 has an uneven surface, as illustrated in FIG. 3B.

In a step S30, a thinning process is performed, using a halftone mask, on a part of the planarization layer 104 located in the light-emitting area 1101 to form a first planarization part 1041 and a second planarization part 1042.

Specifically, the step S30 further includes the following steps.

Figure 3C:
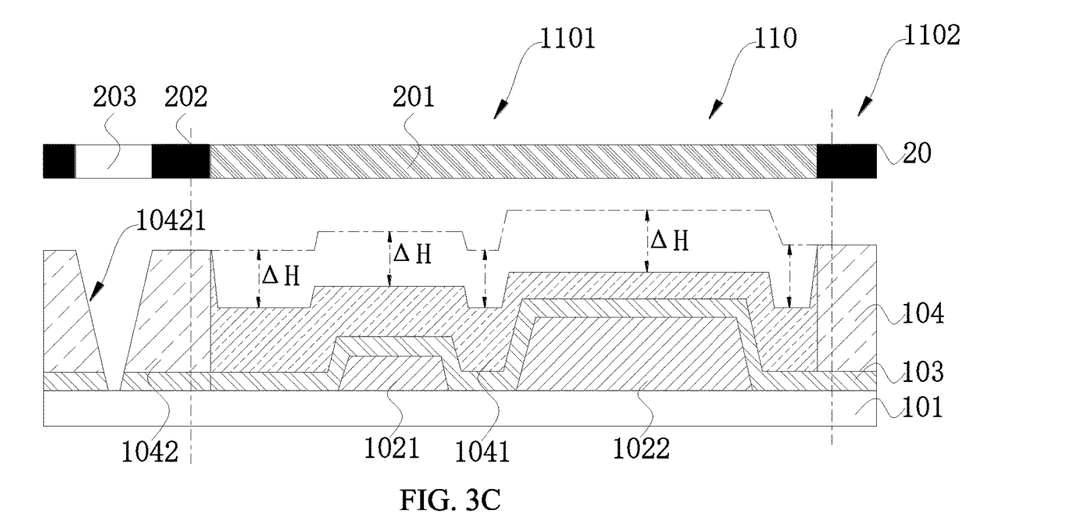

First, the halftone mask 20 is provided. The halftone mask 20 has a half exposure part 201, a complete nonexposure part 202, and a complete exposure part 203. Then, the thinning process through exposure is performed, using the halftone mask 20, on the planarization layer 104. A part of the planarization layer 104 corresponding to the half exposure part 201 forms the first planarization part 1041. A part of the planarization layer 104 corresponding to the complete nonexposure part 202 forms the second planarization part 1042. A part of the planarization layer 104 corresponding to the complete exposure part 203 forms a first through hole 10421. Because exposure energy of the half exposure part 201 is same, thickness ΔH subtracted from thickness of the planarization layer 104 is same. Thus, the first planarization part 1041 has an uneven surface and corresponds to the light-emitting area 1101. The second planarization part 1042 is in contact with two edges of the first planarization part 1041 and corresponds to the defining area 1102 and a part of the light-emitting area 1101. The second planarization part 1042 has an even surface. Thickness of the first planarization part 1041 is lesser than thickness of the second planarization part 1042. Specifically, the first through hole 10421 corresponds to the defining area 1102. The first through hole 10421 extends through the planarization layer 104 and the passivation layer 103 and exposes the TFT array substrate 101, as illustrated in FIG. 3C.

In a step S40, a planarization-compensating layer 105 is printed, using the second planarization part 1042 as a barrier, on the first planarization part 1041. Height of a surface of the planarization-compensating layer 105 from the surface of the TFT array substrate 101 and height of a surface of the second planarization part from the surface of the TFT array substrate are level.

Specifically, the step S40 further includes the following steps.

Figure 3D:
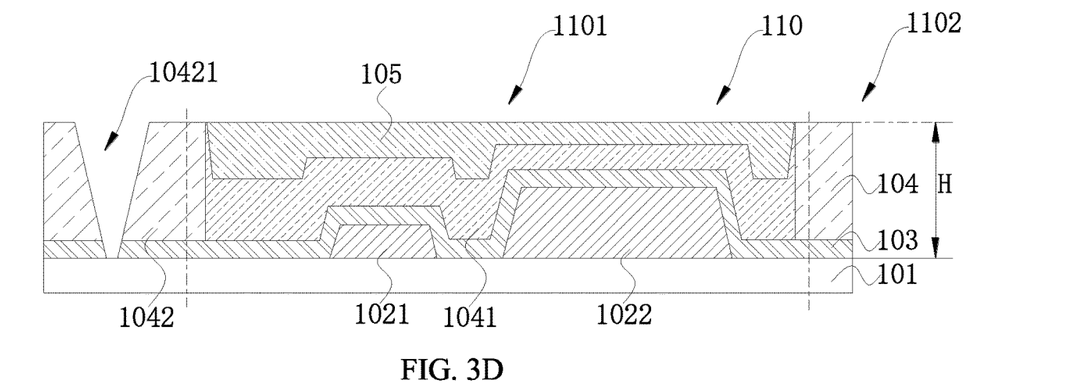

The planarization-compensating layer 105 is printed on the first planarization part 1041 by an IJP process using the second planarization part 1042 as the barrier. Because organic ink itself has fluidity, the organic ink, after dried, automatically fills according to topography, and fills up the uneven surface of the first planarization part 1041. Finally, the height of the surface of the planarization-compensating layer 105 from the surface of the TFT array substrate 101 and the height of the surface of the second planarization part from the surface of the TFT array substrate are level, and are both H. Preferably, a material of the planarization-compensating layer 105 is an organic insulating material, as illustrated in FIG. 3D.

In a step S50, an anode metal layer 106 is manufactured on the planarization-compensating layer 105 and second planarization part 1042. Then, a pixel defining layer 107 is manufactured on the second planarization part 1042. The pixel defining layer 107 covers a part of the anode metal layer 106.

Specifically, the step S50 further includes the following steps.

Figure 3E:
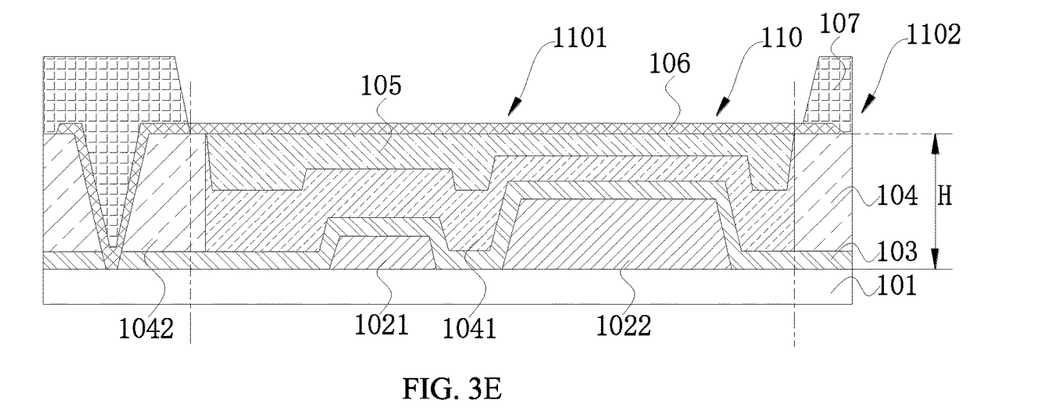

The anode metal layer 106 is manufactured on the planarization-compensating layer 105 and the second planarization part 1042. The anode metal layer 106 is connected to the TFT array substrate 101 through the first through hole 10421. A material of the anode metal layer is preferably a three-layered conductive layer of ITO/Ag/ITO or a single-layered transmissive conductive layer of ITO. That is, the OLED display panel can be top-emitting or bottom-emitting. The top-emitting OLED display panel and the bottom-emitting OLED display panel correspond to anode electrodes which are a reflective anode such as ITO/Ag/ITO and an ITO transmissive anode, respectively. Then, the pixel defining layer 107 is manufactured on the second planarization part 1042. The pixel defining layer 107 covers two edges of the anode metal layer 106. A material of the pixel defining layer 107 is an inorganic insulating layer material. The pixel defining layer 107 defines the light-emitting area 1101 and the defining area 1102, as illustrated in FIG. 3E.

In a step S60, an organic light-emitting layer 108 is printed, using the pixel defining layer 107 as a barrier, on a part of the anode metal layer 106 corresponding to the light-emitting area 1102.

Specifically, the step S60 further includes the following steps.

Figure 3F:
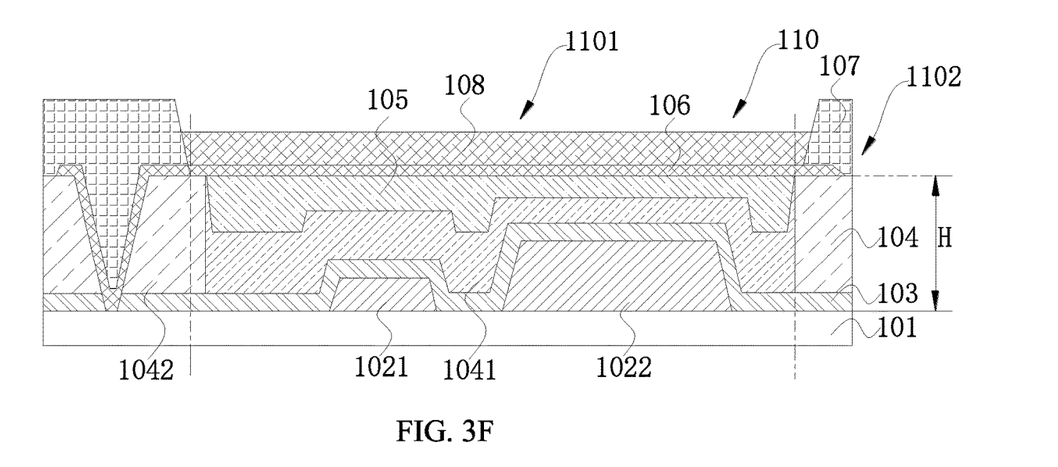

The organic light-emitting layer 108 is printed on the part of the anode metal layer 106 corresponding to the light-emitting area 1102 by an IJP process using the pixel defining layer 107 as the barrier. The organic light-emitting layer 108 is used to cause the OLED display panel to emit light, as illustrated in FIG. 3F.

In the method for manufacturing the OLED display panel provided by the embodiments of the present disclosure, flatness of an IJP-AMOLED substrate is enhanced without adding a mask, causing spread thickness of printed organic ink to be even, preventing light emission by backplane lighting from being uneven, affecting OLED device life or efficiency.

For specific embodiments of each of the above operations, refer to the foregoing embodiments. Details are omitted here.

In summary, for the OLED display panel and the method for manufacturing the same provided by the embodiments of the present disclosure, the part of the planarization layer in the light-emitting area having the uneven surface is thinned, and filling of the planarization-compensating layer is performed. In the light-emitting area, an organic film layer with higher flatness can be obtained. Thus, the following problem for the existing IJP-AMOLED manufacturing process is solved. It is difficult for the PLN to meet the flatness manufacturing requirement. The maximum step difference of the entire pixel area is larger. Spreadability of jetted organic ink is uneven. After drying, the film thickness of the light-emitting layer is uneven, thereby affecting the display effect of the OLED display panel.

It can be understood that, to persons of ordinary skill in the art, in accordance with the technical solutions of the present disclosure and an inventive concept thereof, equivalent replacements or changes can be made. All of these changes and replacements should fall within the protection scopes of the appended claims of the present disclosure.

What is claimed is:

1. An organic light-emitting diode (OLED) display panel, comprising:
   a thin film transistor (TFT) array substrate having a plurality of pixel areas; wherein each pixel area comprises a light-emitting area and a defining area surrounding the light-emitting area; wherein a surface of the TFT array substrate further has at least one protrusion corresponding to the light-emitting area;
   a passivation layer manufactured on the surface of the TFT array substrate and completely covering the at least one protrusion;
   a planarization layer manufactured on the passivation layer; wherein the planarization layer has a first planarization part and a second planarization part; wherein the first planarization part has an uneven surface and corresponds to the light-emitting area; wherein the second planarization part is in contact with two edges of the first planarization part and corresponds to the defining area and a part of the light-emitting area; wherein a thickness of the first planarization part is less than a thickness of the second planarization part;
   a planarization-compensating layer manufactured on the first planarization part; wherein a height of a surface of the planarization-compensating layer from the surface of the TFT array substrate and a height of a surface of the second planarization part from the surface of the TFT array substrate are level;
   an anode metal layer manufactured on the second planarization part and the planarization-compensating layer;
   a pixel defining layer manufactured on the second planarization part and covering a part of the anode metal layer; and
   an organic light-emitting layer manufactured on the anode metal layer and corresponding to the light-emitting area;
   wherein the planarization-compensating layer is manufactured by an inkjet printing process printing an organic ink.

2. The OLED display panel of claim 1, wherein a material of the planarization layer is a hydrophobic organic material.

3. The OLED display panel of claim 1, wherein the anode metal layer is a three-layered conductive layer of indium tin oxide (ITO)/silver(Ag)/ITO or a single-layered transmissive conductive layer of ITO.

4. The OLED display panel of claim 1, wherein the TFT array substrate is any type of low-temperature polysilicon TFT, oxidized TFT, and solid phase crystallized polysilicon TFT.

5. The OLED display panel of claim 1, wherein a material of the passivation layer is silicon nitride or silicon oxide.

6. The OLED display panel of claim 1, wherein a material of the planarization-compensating layer is an organic insulating material.

7. An organic light-emitting diode (OLED) display panel, comprising:
   a thin film transistor (TFT) array substrate having a plurality of pixel areas; wherein each pixel area comprises a light-emitting area and a defining area surrounding the light-emitting area; wherein a surface of the TFT array substrate further has at least one protrusion corresponding to the light-emitting area;
   a passivation layer manufactured on the surface of the TFT array substrate and completely covering the at least one protrusion;
   a planarization layer manufactured on the passivation layer; wherein the planarization layer has a first planarization part and a second planarization part; wherein the first planarization part has an uneven surface and corresponds to the light-emitting area; wherein the second planarization part is in contact with two edges of the first planarization part and corresponds to the defining area and a part of the light-emitting area; wherein a thickness of the first planarization part is less than a thickness of the second planarization part;
   a planarization-compensating layer manufactured on the first planarization part; wherein a height of a surface of the planarization-compensating layer from the surface of the TFT array substrate and a height of a surface of the second planarization part from the surface of the TFT array substrate are level;
   an anode metal layer manufactured on the second planarization part and the planarization-compensating layer;
   a pixel defining layer manufactured on the second planarization part and covering a part of the anode metal layer; and
   an organic light-emitting layer manufactured on the anode metal layer and corresponding to the light-emitting area.

8. The OLED display panel of claim 7, wherein a material of the planarization layer is a hydrophobic organic material.

9. The OLED display panel of claim 7, wherein the anode metal layer is a three-layer ITO/Ag/ITO conductive layer or a single-layer ITO transmissive conductive layer.

10. The OLED display panel of claim 7, wherein the TFT array substrate is any type of low-temperature polysilicon TFT, oxidized TFT, and solid phase crystallized polysilicon TFT.

11. The OLED display panel of claim 7, wherein a material of the passivation layer is silicon nitride or silicon oxide.

12. The OLED display panel of claim 7, wherein a material of the planarization-compensating layer is an organic insulating material.

13. A method for manufacturing an organic light-emitting diode (OLED) display panel, wherein the method comprises:
   a step (S10) of providing a thin film transistor (TFT) array substrate; wherein the TFT array substrate has a plurality of pixel areas; wherein each pixel area comprises a light-emitting area and a defining area surrounding the light-emitting area; wherein a surface of the TFT array substrate further has at least one protrusion corresponding to the light-emitting area;
   a step (S20) of sequentially manufacturing a passivation layer and a planarization layer on the surface of the TFT array substrate; wherein the passivation layer completely covers the at least one protrusion; wherein an area of the planarization layer corresponding to a part of the light-emitting area has an uneven surface;

a step (S30) of performing, using a halftone mask, a thinning process on a part of the planarization layer located in the light-emitting area to form a first planarization part and a second planarization part;

a step (S40) of printing, using the second planarization part as a barrier, a planarization-compensating layer on the first planarization part; wherein a height of a surface of the planarization-compensating layer from the surface of the TFT array substrate and a height of a surface of the second planarization part from the surface of the TFT array substrate are level;

a step (S50) of manufacturing an anode metal layer on the planarization-compensating layer and second planarization part, and then manufacturing a pixel defining layer on the second planarization part; wherein the pixel defining layer covers a part of the anode metal layer; and a step (S60) of printing, using the pixel defining layer as a barrier, an organic light-emitting layer on a part of the anode metal layer corresponding to the light-emitting area.

14. The method for manufacturing an OLED display panel of claim 13, wherein in the step (S10), the TFT array substrate is any type of low-temperature polysilicon TFT, oxidized TFT, and solid phase crystallized polysilicon TFT.

15. The method for manufacturing an OLED display panel of claim 13, wherein in the step (S20), a material of the planarization layer is a hydrophobic organic material.

16. The method for manufacturing an OLED display panel of claim 13, wherein in the step (S20), a material of the passivation layer is silicon nitride or silicon oxide.

17. The method for manufacturing an OLED display panel of claim 13, wherein in the step (S30), the second planarization part is in contact with two edges of the first planarization part and corresponds to the defining area and a part of the light-emitting area, and a thickness of the first planarization part is less than a thickness of the second planarization part.

18. The method for manufacturing an OLED display panel of claim 13, wherein the step (S30) further comprises:
a step (S301) of forming a first through hole in a part of the planarization layer corresponding to the defining area; wherein the first through hole extends through the planarization layer and the passivation layer and exposes the TFT array substrate.

19. The method for manufacturing an OLED display panel of claim 13, wherein in the step (S40), a material of the planarization-compensating layer is an organic insulating material.

20. The method for manufacturing an OLED display panel of claim 13, wherein in the step (S50), wherein the anode metal layer is a three-layered conductive layer of indium tin oxide (ITO)/silver(Ag)/ITO or a single-layered transmissive conductive layer of ITO, and a material of the pixel defining layer is an inorganic insulating layer material.

* * * * *